US010770573B2

(12) United States Patent
Shaked et al.

(10) Patent No.: US 10,770,573 B2
(45) Date of Patent: Sep. 8, 2020

(54) APPARATUS, SYSTEM AND METHOD OF AN ELECTROSTATICALLY FORMED NANOWIRE (EFN)

(71) Applicants: TOWER SEMICONDUCTOR LTD., Migdal Haemek (IL); RAMOT at Tel Aviv University Ltd., Tel Aviv (IL)

(72) Inventors: Zohar Shaked, Ramat Yishai (IL); Yakov Roizin, Afula (IL); Menachem Vofsy, Kiriat Tivon (IL); Alexey Heiman, Ramat Yishai (IL); Yossi Rosenwaks, Hod Hasharon (IL); Klimentiy Shimanovich, Ramat Gan (IL); Yhonatan Vaknin, Yoqneam Illit (IL)

(73) Assignees: TOWER SEMICONDUCTOR LTD., Migdal Haemek (IL); RAMOT AT TEL AVIV UNIVERSITY LTD., Tel Aviv (IL)

( * ) Notice: Subject to any disclaimer, the term of this patent is extended or adjusted under 35 U.S.C. 154(b) by 0 days.

(21) Appl. No.: 16/136,714

(22) Filed: Sep. 20, 2018

(65) Prior Publication Data
US 2020/0098906 A1 Mar. 26, 2020

(51) Int. Cl.
*H01L 29/775* (2006.01)
*G01N 27/414* (2006.01)
*H01L 29/10* (2006.01)
*H01L 27/12* (2006.01)
(Continued)

(52) U.S. Cl.
CPC ....... *H01L 29/775* (2013.01); *G01N 27/4141* (2013.01); *G01N 27/4146* (2013.01); *H01L 27/1203* (2013.01); *H01L 29/1029* (2013.01); *H01L 29/42316* (2013.01); *H01L 29/66439* (2013.01)

(58) Field of Classification Search
None
See application file for complete search history.

(56) References Cited

U.S. PATENT DOCUMENTS 7,157,054 B2    1/2007 Toyoda et al.
7,495,300 B2    2/2009 Gardner et al.
(Continued)

OTHER PUBLICATIONS

Ping Feng, Feng Shao, Yi Shi and Qing Wan, "Gas Sensors Based on Semiconducting Nanowire Field-Effect Transistors", Sensors 2014, 14, 17406-17429; 24 pages.
(Continued)

*Primary Examiner* — Chandra Chaudhari
(74) *Attorney, Agent, or Firm* — Shichrur & Co.

(57) ABSTRACT

For example, an Electrostatically Formed Nanowire (EFN) may include a source region; at least one drain region; a wire region configured to drive a current between the source and drain regions via a conductive channel; a first lateral-gate area extending along a first surface of the wire region between the source and drain regions; a second lateral-gate area extending along a second surface of the wire region between the source and drain regions; and a sensing area in opening in a backside of a silicon substrate under the wire region and the first and second lateral-gate areas, the sensing area configured to, in reaction to a predefined substance, cause a change in a conductivity of the conductive channel.

16 Claims, 10 Drawing Sheets

(51) Int. Cl.
*H01L 29/66* (2006.01)
*H01L 29/423* (2006.01)

(56) References Cited

U.S. PATENT DOCUMENTS

| | | | |
|---|---|---|---|
| 8,293,556 B2* | 10/2012 | Park | G01N 27/128 |
| | | | 257/414 |
| 8,859,317 B2 | 10/2014 | Hsieh et al. | |
| 2005/0212531 A1* | 9/2005 | Wei | G01N 27/4146 |
| | | | 324/664 |
| 2015/0017740 A1 | 1/2015 | Shalev et al. | |

OTHER PUBLICATIONS

Eran Socher, Salomon Michel Beer, and Yael Nemirovsky, "Temperature Sensitivity of SOI-CMOS Transistors or Use in Uncooled Thermal Sensing", IEEE Transactions on Electron Devices, vol. 52, No. 12, Dec. 2005, 7 pages.

* cited by examiner

APPARATUS, SYSTEM AND METHOD OF AN ELECTROSTATICALLY FORMED NANOWIRE (EFN)

TECHNICAL FIELD

Embodiments described herein generally relate to an Electrostatically Formed Nanowire (EFN).

BACKGROUND

Nanowires may be configured for use in various sensing systems, for example, in gas sensors. A high surface to volume ratio of the nanowires may make a nanowire, for example, suitable for sensing of low densities of molecules absorbed at the surfaces of the nanowire.

However, fabrication of nanowires is complicated, not reproducible, and has trade-offs when the nanowires have to be implemented on hot plates for gas sensing.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an electronic device, a computing device, an integrated computing device, an integrated chip, electronic circuitry, a processing device, an electrical device, a sensor, a temperature sensor, a gas sensor, an Internet of Things (IoT) device, a processor, a memory device, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Integrated Circuit" (IC), as used herein, may relate to a set of one or more electronic circuits on a semiconductor material. For example, the electronic circuit may include electronic components and their interconnectors.

Figure 1A:
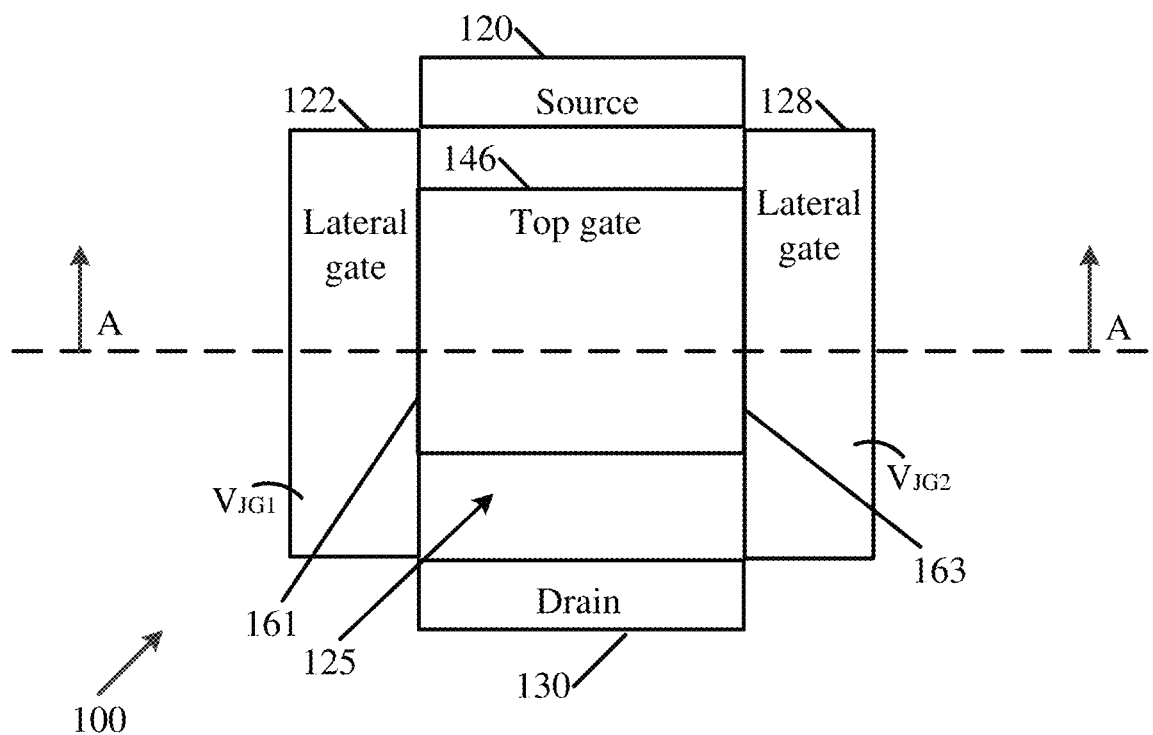
FIG. 1A is a schematic illustration of an Electrostatically Formed Nanowire (EFN)
Figure 1B:
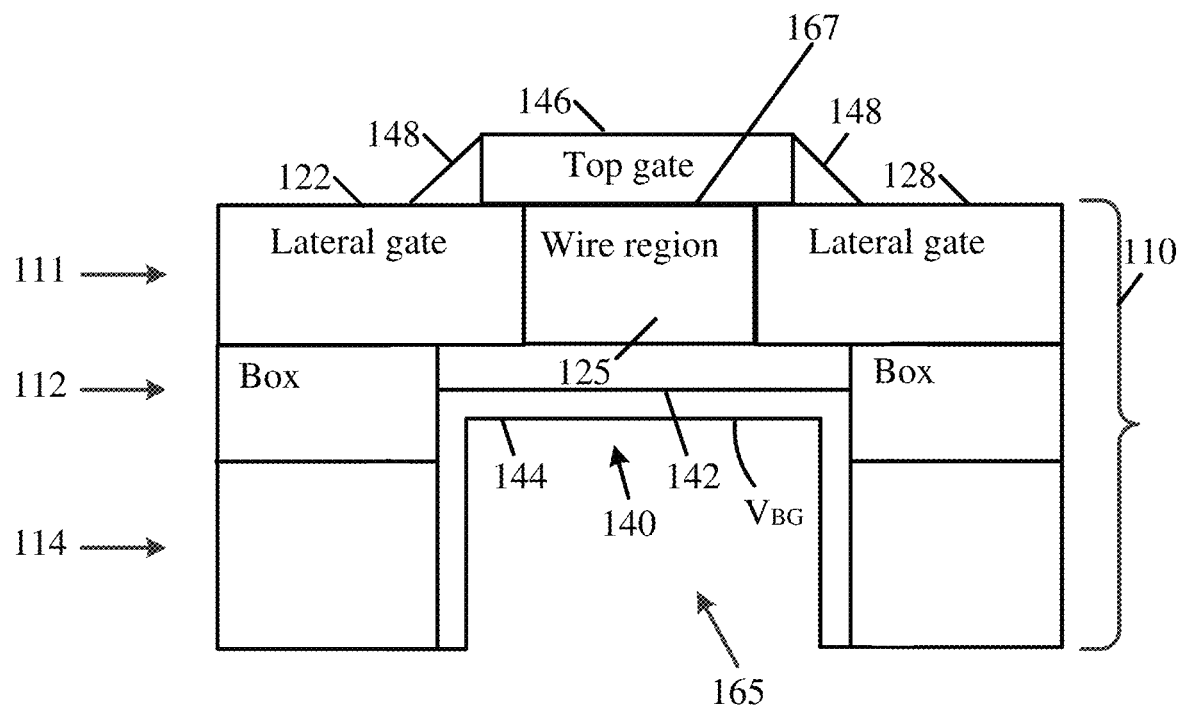
FIG. 1B is a schematic illustration of a cross section view of the EFN, in accordance with some demonstrative embodiments.

Reference is made to FIG. 1A, which schematically illustrates an Electrostatically Formed Nanowire (EFN) 100, and to FIG. 1B, which schematically illustrates a across section "AA" of EFN 100, in accordance with some demonstrative embodiments.

In some demonstrative embodiments, EFN 100 may include, or may be operable as, a gas sensor configured to sense a predefined type of gas, e.g., as described below.

In other embodiments, EFN 100 may be operable and/or included as part of any other sensor and/or device.

In some demonstrative embodiments, EFN 100 may be implemented as part of an electronic device, e.g., as described below.

In some demonstrative embodiments, the electronic device may include an Internet of Things (IoT) device.

In some demonstrative embodiments, the electronic device may include a gas sensing device, e.g., as described below.

In some demonstrative embodiments, the electronic device may include any other electronic device.

In some demonstrative embodiments, EFN 100 may include an Integrated Circuit (IC).

In one example, the electronic circuit or the IC may include, may be part of, and/or may be implemented as part of the electronic device.

In some demonstrative embodiments, EFN 100 may be formed on a silicon substrate 110, e.g., as described below.

In some demonstrative embodiments, EFN 100 may include a back-sensing EFN. For example, EFN 100 may have a sensing are on a backside of silicon substrate 110, e.g., as described below.

In other embodiments, EFN 100 may include a front-sensing EFN. For example, EFN 100 may have a sensing area on a front-side of silicon substrate 110, e.g., as described below.

In some demonstrative embodiments, silicon substrate 110 may include a Silicon On Insulator (SOI) substrate, e.g., as described below.

In some demonstrative embodiments, silicon substrate 110 may include a device layer 111 (also referred to as an "active layer" or "active area").

In some demonstrative embodiments, silicon substrate 110 may include a Buried Oxide (BOX) layer 112, e.g., as described below.

In some demonstrative embodiments, silicon substrate 110 may include a silicon layer 114, e.g., as described below.

In some demonstrative embodiments, EFN 100 may include a Field Effect Transistor (FET), e.g., as described below.

In some demonstrative embodiments, the FET may include a multi-gate FET, e.g., as described below.

In some demonstrative embodiments, EFN 100 may include a source region 120, e.g., as described below.

In some demonstrative embodiments, EFN 100 may include at least one drain region 130, e.g., as described below.

In some demonstrative embodiments, the source region 120 and/or the drain region 130 may include heavily doped N-type silicon (N+), e.g., as described below.

In some demonstrative embodiments, EFN 100 may include a wire region 125 configured to drive a current between source region 120 and drain region 130, for example, via a conductive channel, e.g., as described below.

In some demonstrative embodiments, it may be advantageous to configured and/or implement a nanowire for one or more functionalities and/or as part of one or more devices.

In one example, nanowires may have an increased gas sensitivity, e.g., compared to bulk silicon, due to a large area to volume ratio of nanowires. Carrier concentration in Nanowire sensors, may be tuned, for example, by gate electrodes, e.g., to have better performance.

However, there may be a need to address one or more technical issues, for example, fabrication of nanowires may be complicated, not reproducible, e.g., in bottom-up approaches, and/or may have trade-offs when the nanowires have to be implemented on hot plates for gas sensing.

In some demonstrative embodiments, wire region 125 may include a quasi-nanowire, which may be formed by electrostatic operations. For example, nanometer scaling of the wire region 125 may be performed electrostatically post fabrication, e.g., as described below.

In some demonstrative embodiments, EFN 100 may include a first lateral-gate area 122 extending along a first surface 161 of wire region 125 between source region 120 and drain region 130, e.g., as described below.

In some demonstrative embodiments, EFN 100 may include a second lateral-gate area 128 extending along a second surface 163 of wire region 125 between source region 120 and drain region 130, e.g., as described below.

In some demonstrative embodiments, the first lateral-gate area 122 and/or the second lateral-gate area 128 may include heavily doped P-type silicon (P+), e.g., as described below.

In some demonstrative embodiments, the first lateral-gate area 122 and/or the second lateral-gate area 128 may be operable to control a lateral size of a depletion region in the wire region 125, e.g., as described below.

In one example, first lateral-gate area 122 may be biased with a first voltage, denoted "$V_{JG1}$", and/or second lateral-gate area 128 may be biased with a second voltage, denoted "$V_{JG2}$", for example, to laterally confine the wire region 125 as a nanowire.

In some demonstrative embodiments, EFN 100 may include a sensing area 140, for example, in an opening 165 in a backside of the silicon substrate 110, for example, under the wire region 125 and the first lateral-gate area 122 and the second lateral-gate area 128, e.g., as described below.

In some demonstrative embodiments, the sensing area 140 may be configured to, for example, in reaction to a predefined substance, cause a change in a conductivity of the conductive channel of wire region 125, e.g., as described below.

In some demonstrative embodiments, the predefined substance may include a gas.

Some demonstrative embodiments are described herein with respect to an EFN including a sensing area configured to react with a gas, for example, if the EFN is to be implemented as part of a gas sensor.

In other embodiments, EFN 100 may include sensing area 140 configured to react with any other substance, for example, if the EFN 100 is to be implemented as part of any other sensor and/or any other device and/or functionality.

In one example, the change in the conductivity of the conductive channel may be related to a chemical reaction with a composition, a chemical structure of a sensitive film, and/or a polarization of a semiconductor film.

In another example, the change in the conductivity of the conductive channel may be related to additional temperature variation, e.g., as a result of endothermic or exothermic reaction with the sensed gas.

In another example, the change in the conductivity of the conductive channel may be related to thermal conductivity of gases, e.g., the effect may be dependent on gas flow, which may result in a temperature change.

In some demonstrative embodiments, the BOX layer 112 may include the sensing area 140, e.g., as described below.

In one example, the opening 165 in silicon substrate 110 may be etched from the backside of the wafer, and a thin film of the BOX layer 112 may be operable as the sensing surface 140.

In some demonstrative embodiments, sensing area 140 may include a dielectric layer 142, which may be, for example, in contact with lateral-gate area 122, lateral gate area 128, and the wire region 125, e.g., as described below.

In one example, dielectric layer 142 may function as a "molecular gate", for example, a surface of dielectric layer 142 may be charged during chemical interaction with the substances in the ambience.

In some demonstrative embodiments, a thickness of the dielectric layer 142 may be between 50-200 Angstrom (A). In other embodiments, any other suitable thickness may be implemented.

In one example, dielectric layer 142 may include Gate Oxide (GOX), which may be formed by oxidation, or deposited dielectric with the thickness of 50-200 A, e.g., on wire region 125.

In one example, BOX layer 112 may be removed from the opening 165 of the wafer, and may be replaced, for example, by dielectric layer 142. For example, dielectric layer 142 may include high K dielectric thin oxide films, which may be grown by a low-temperature deposition technique, e.g., below 450 Celsius (C), for example, an Atomic Layer Deposition (ALD) alumina or Hafnia deposition technique, an ALD SiO2 or SiN deposition technique, or any other deposition technique.

In another example, dielectric layer 142 may be formed of any other material and/or may have any other thickness and/or other properties.

In some demonstrative embodiments, EFN 100 may include a functional layer 144 at the backside of the silicon substrate 110 and in contact with the sensing area 140, e.g., as described below.

In some demonstrative embodiments, the functional layer 144 may be configured to react with the predefined substance, e.g., as described below.

In some demonstrative embodiments, the functional layer 144 may include Palladium, Platinum and/or any other material, e.g., as described below.

In one example, functionalization of layer 144 may be performed by deposition, e.g., sputtering, of metals, e.g., Palladium, Platinum and/or any other metal.

In some demonstrative embodiments, one or more functionalization layers of functional layer 144 may be formed in several sequential masking steps.

In some demonstrative embodiments, the functional layer 144 may be operable as a backside-gate to control a vertical size of a depletion region in the wire region 125, e.g., as described below.

In one example, the metal layer of functional layer 144 may be used as a back-gate to facilitate control of the EFN 100, e.g., as described below.

In some demonstrative embodiments, functional layer 144 may be biased with a third voltage, denoted $V_{bg}$, for example, to control the vertical size of the depletion region in the wire region 125.

In some demonstrative embodiments, EFN 100 may include a top-gate area 146 over a third surface 167 of the wire region 125, e.g., as described below.

In some demonstrative embodiments, the top-gate area 146 may be operable to control a vertical size of the depletion region in the wire region 125, e.g., as described below.

In some demonstrative embodiments, the top-gate area 146 may include hard masked poly silicon (Poly), e.g., as described below.

In one example, the hard masked poly silicon may be placed on the Gate Oxide (GOX) of silicon substrate 110.

In some demonstrative embodiments, EFN 100 may include a spacer region 148, for example, around the top-gate area 146, e.g., as described below.

In some demonstrative embodiments, the spacer region 148 may include one or more spacers configured to isolate the top-gate area 146, e.g., as described below.

Figure 2:
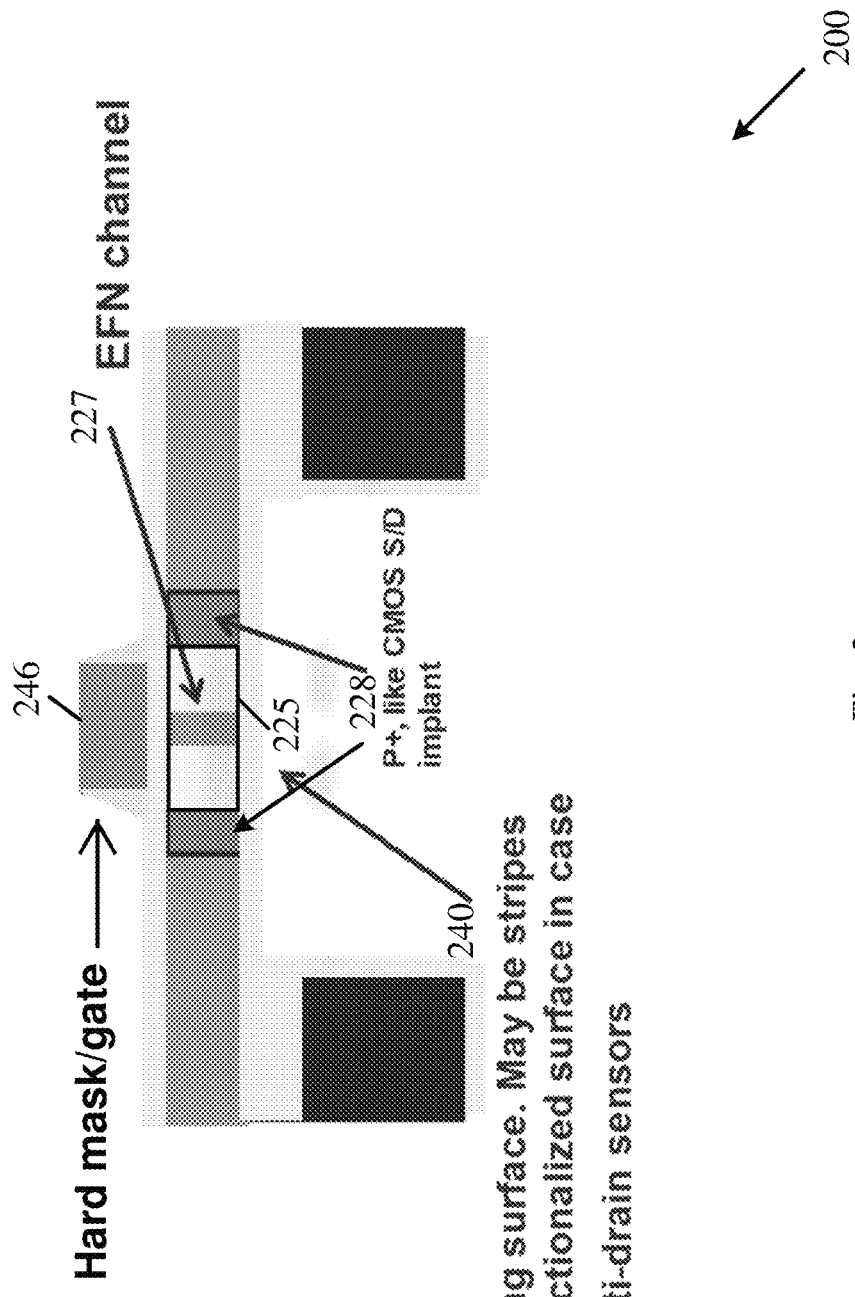
FIG. 2 is a schematic illustration of a cross section view of an EFN, in accordance with some demonstrative embodiments.

Reference is made to FIG. 2, which schematically illustrates a cross section view of an EFN 200, in accordance with some demonstrative embodiments.

In one example, one or more elements of EFN 200 may be included and/or implemented in EFN 100 (FIG. 1).

In some demonstrative embodiments, as shown in FIG. 2, EFN 200 may include a top gate area 246.

In one example, top gate area 246 may be formed from hard mask, e.g., the hard masked poly silicon, which may not be removed. For example, a contact may be connected to the Poly, which may act as a top gate to control a conductive channel 227 of EFN 200.

In some demonstrative embodiments, as shown in FIG. 2, EFN 200 may include first and second lateral-gate areas 228.

In some demonstrative embodiments, as shown in FIG. 2, first and second lateral-gate areas 228 may include heavily doped P-type silicon (P+).

In some demonstrative embodiments, as shown in FIG. 2, EFN 200 may include a wire region 225 configured to drive a current via conductive channel 227.

In some demonstrative embodiments, as shown in FIG. 2, EFN 200 may include a sensing area 240 in an opening in a backside of the silicon substrate, for example, under the wire region 225 and the first and second lateral-gate areas 228.

Figure 3:
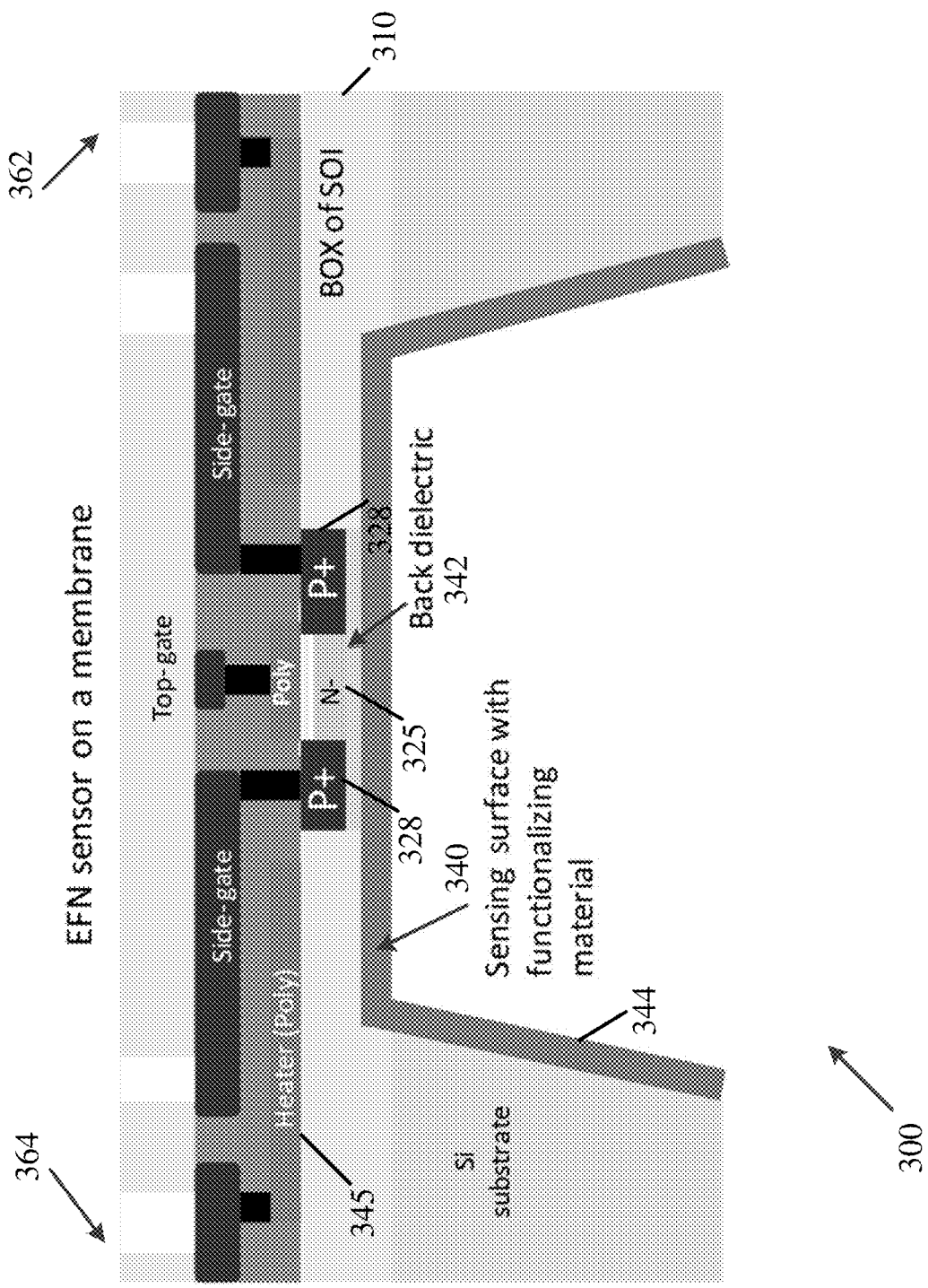
FIG. 3 is a schematic illustration of a cross section view of an EFN on a membrane, in accordance with some demonstrative embodiments.

Reference is made to FIG. 3, which schematically illustrates a cross section of an EFN 300 on a membrane, in accordance with some demonstrative embodiments.

In one example, one or more elements of EFN 300 may be included and/or implemented in EFN 100 (FIG. 1).

In some demonstrative embodiments, as shown in FIG. 3, EFN 300 may include a membrane EFN to be formed on a membrane, for example, where edges of the EFN 300 may be in contact with bulk SOI.

For example, a first edge 362 of EFN 300 may be in contact with bulk silicon, and/or a second edge 364 of EFN 300 may be in contact with the bulk silicon.

In some demonstrative embodiments, as shown in FIG. 3, EFN 300 may include a top gate area 346.

In one example, top gate area 346 may be formed from Poly, e.g., hard masked poly silicon, which may not be removed. For example, a contact may be connected to the Poly, which may act as top-gate 346 to control EFN 300.

In some demonstrative embodiments, as shown in FIG. 3, EFN 300 may include first and second lateral-gate areas 328.

In some demonstrative embodiments, as shown in FIG. 3, the first and second lateral-gate areas 328 may include heavily doped P-type silicon (P+).

In some demonstrative embodiments, as shown in FIG. 3, EFN 300 may include a wire region 325 configured to drive a current via a conductive channel.

In some demonstrative embodiments, the first and second lateral-gate areas 328 may be operable to control a lateral size of a depletion region in the wire region 325.

In some demonstrative embodiments, as shown in FIG. 3, EFN 300 may include a sensing area 340 in an opening in a backside of the silicon substrate, for example, under the wire region 325 and the first and second lateral-gate areas 328.

In some demonstrative embodiments, as shown in FIG. 3, EFN 300 may include a dielectric layer 342 in contact with the first and second lateral-gate areas 328 and the wire region 325.

In some demonstrative embodiments, as shown in FIG. 3, EFN 300 may include a functional layer 344 at the backside of the silicon substrate and in contact with the sensing area 340, e.g., as described below.

In one example, functional layer 344 may include metals and/or oxides, which may have catalytic properties. For example, platinum, palladium and/or their compounds may be used as catalysts.

In some demonstrative embodiments, the functional layer 344 may be operable as a backside-gate to control a vertical size of a depletion region in the wire region 325.

In some demonstrative embodiments, as shown in FIG. 3, EFN 300 may include a heater 345 configured to heat the wire region 325.

In one example, as shown in FIG. 3, heater 345 may be formed of Polysilicon (Poly) and/or Tungsten. In other embodiments, heater 345 may be formed of any other material.

In one example, a level of heating of wire region 325 by heater 345 may allow selective sensing of different gases. For example, combustible gas mixtures may typically not be oxidized until they reach some threshold temperature. Electrically conductive materials change their conductivity as a function of temperature. Sensing an increase in temperature of sensing area 340 may be performed using the gas sensing materials themselves, e.g. changes in resistance of the platinum catalyst, and/or resistance of the heater 345.

In some demonstrative embodiments, as shown in FIG. 3, heater 345 may be formed on the membrane.

In some demonstrative embodiments, EFN 300 may be fabricated in a self-aligned process, e.g., as described below.

In some demonstrative embodiments, EFN 300 may be built in a thin layer of SOI wafer, for example, using a self-aligned fabrication process for planar gate electrodes, e.g., as described below.

In some demonstrative embodiments, the functional layer 344, e.g., a gas sensitive surface, may be formed at the backside of the wafer, for example, by further etching the SOI handle wafer with an etch stop at BOX layer 310.

In some demonstrative embodiments, as shown in FIG. 3, EFN 300 may include four gates, e.g., to electrostatically form the quasi-nanowire.

In some demonstrative embodiments, the four gates may include two planar gates, e.g., the first and second lateral-gate areas 328, and two vertical gates, for example, a Poly gate at the front surface, e.g., top-gate area 346, and a functionalizing electrode, e.g., functional layer 344, serving as a back gate.

In one example, the four gates may form a "quasi-nanowire" channel, e.g., in wire region 325, which may be isolated from device surfaces, for example, by depletion regions.

In some demonstrative embodiments, an EFN, e.g., EFN 300, having a channel isolated from device surfaces and/or having the sensing surface 340 inside the opening at the backside of the wafer, may achieve a low noise readout translated into increased sensitivity of gas sensing.

Referring back to FIG. 1, in some demonstrative embodiments, EFN 100 may include a multi-drain EFN, e.g., as described below.

In some demonstrative embodiments, EFN 100 may include at least first and second drain regions 130, e.g., as described below with reference to FIGS. 4A, 4B, and 4C.

In some demonstrative embodiments, the wire region 125 may be configured to, for example, based on a first voltage at the first lateral-gate area 122 and a second voltage at the second lateral-gate area 128, drive the current between the source region 130 and the first drain region or the second drain region, e.g., as described below.

Reference is made to FIG. 4A, which schematically illustrates a multi-drain EFN 400, to FIG. 4B, which schematically illustrates a cross section view "AA" of EFN 400, and to FIG. 4C, which schematically illustrates a top view of EFN 400, in accordance with some demonstrative embodiments.

In some demonstrative embodiments, EFN 400 may include a source region 420.

In some demonstrative embodiments, EFN 400 may include a first drain region 432 and a second drain region 434.

In some demonstrative embodiments, EFN 400 may include a wire region 425 configured to drive a current between the source region 420 and the first drain region 432 or the second drain region 434.

In some demonstrative embodiments, the wire region 425 may be configured to drive the current between the source region 420 and the first drain region 432 or the second drain region 434, for example, based on a first voltage, denoted "$V_{G,1}$", at a first lateral-gate area 422 and a second voltage, denoted "$V_{G,2}$", at a second lateral-gate area 428.

In some demonstrative embodiments, a conductive channel 427 may be shifted, e.g., between drain regions 432 and 434, with respect to a surface of EFN 400.

Figure 5:
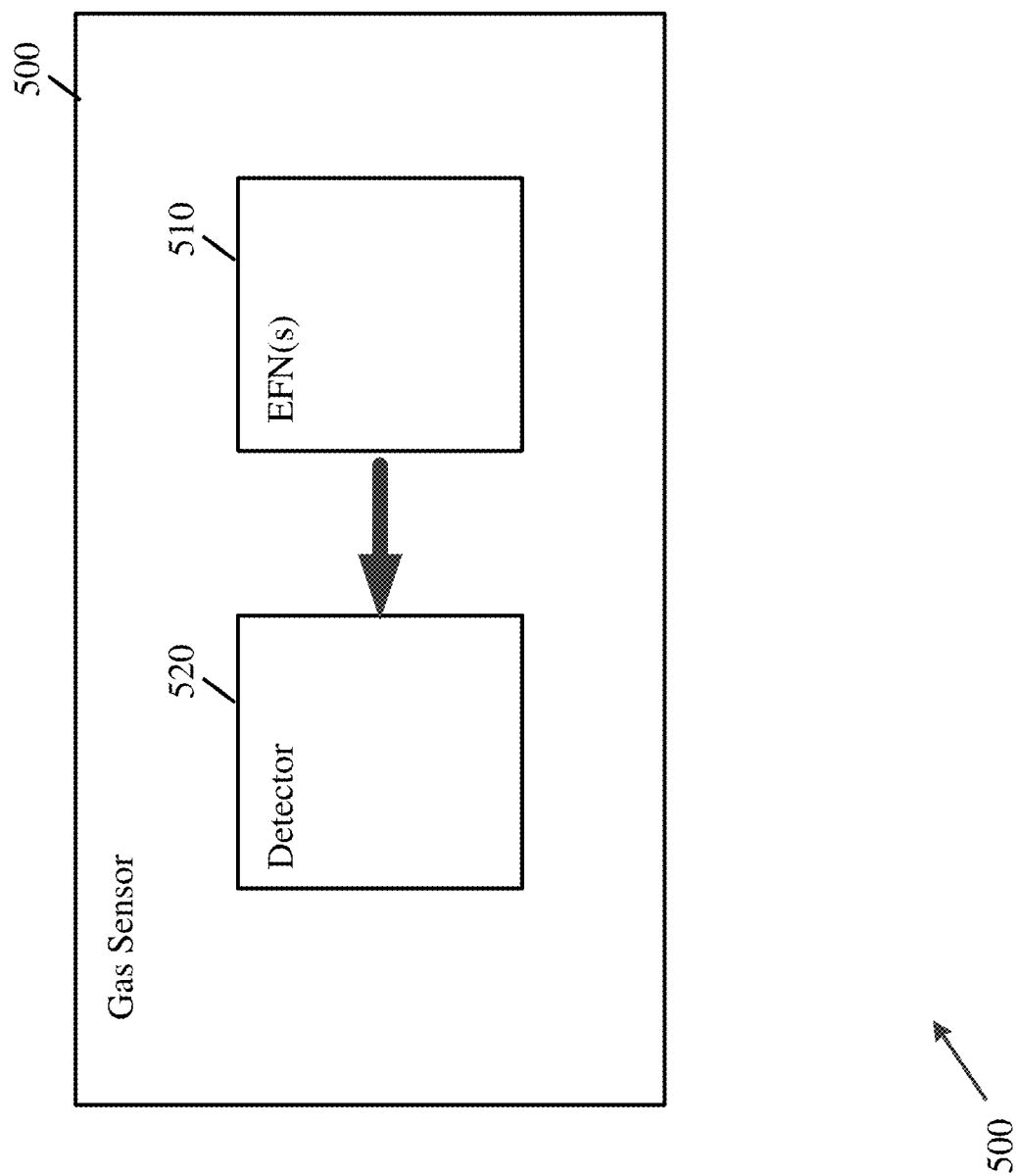
FIG. 5 is a schematic block diagram illustration of a gas sensor, in accordance with some demonstrative embodiments.

Reference is made to FIG. 5, which schematically illustrates a gas sensor 500, in accordance with some demonstrative embodiments.

In some demonstrative embodiments, gas sensor 500 may include at least one EFN 510 configured to sense at least one predefined type of gas, e.g., as described below.

In some demonstrative embodiments, gas sensor 500 may include a back-sensing EFN.

In some demonstrative embodiments, gas sensor 500 may include a front-sensing EFN.

Figure 4:
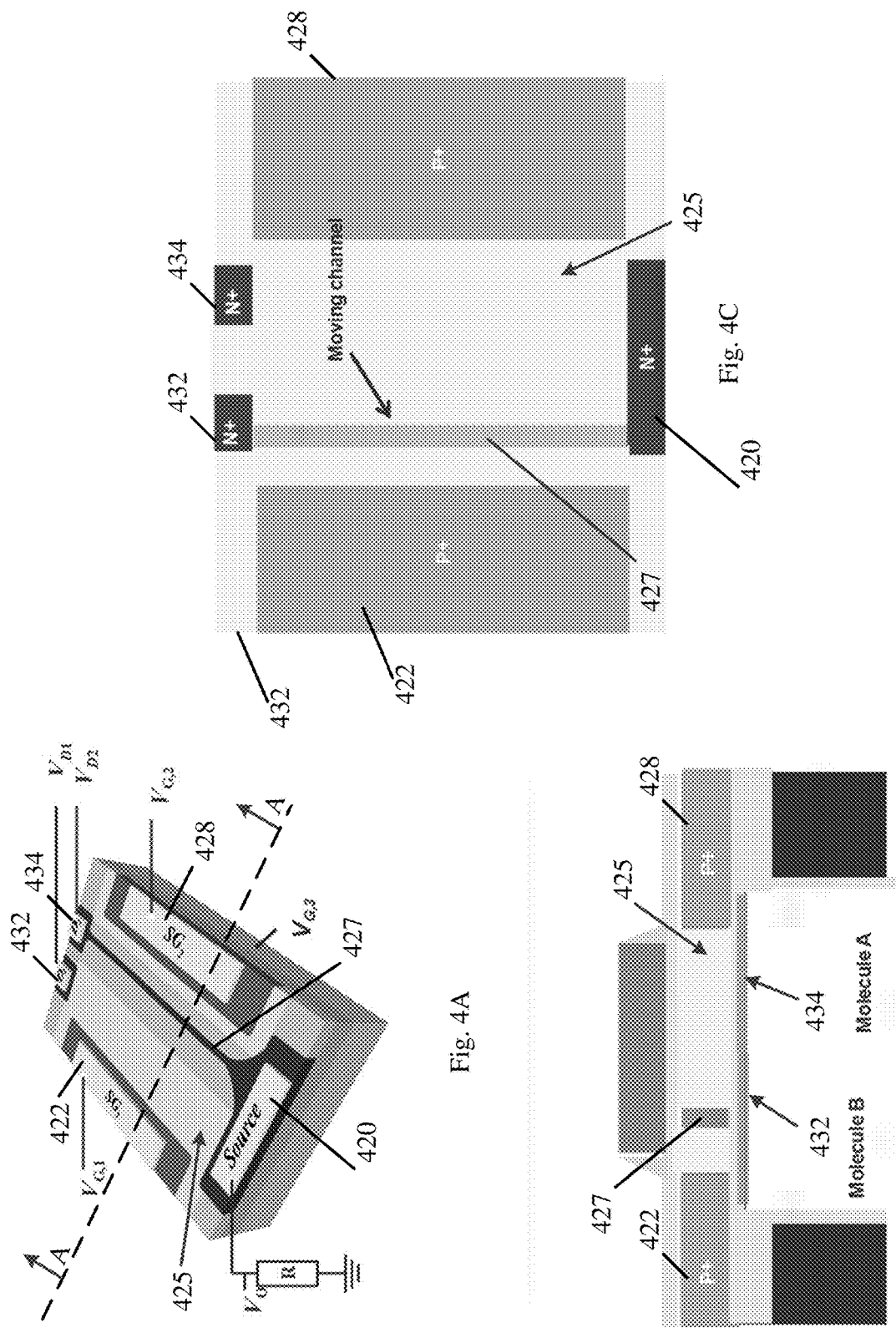
FIG. 4A is a schematic illustration of a multi-drain EFN.
FIG. 4B is a cross section view of the multi-drain EFN.
FIG. 4C is a top view of the multi-drain EFN, in accordance with some demonstrative embodiments.

In some demonstrative embodiments, gas sensor 500 may include EFN 100 (FIG. 1), EFN 200 (FIG. 2), EFN 300 (FIG. 3), or EFN 400 (FIG. 4).

In some demonstrative embodiments, gas sensor 500 may include a single EFN to sense a single predefined type of gas, e.g., as described below.

In some demonstrative embodiments, gas sensor 500 may include two or more EFNs 510 (also referred to as a "multi-EFN") configured to sense two or more respective predefined types of gas, e.g., as described below.

In one example, gas sensor 500 may include two or mores EFN 100 (FIG. 1), EFNs 200 (FIG. 2), EFNs 300 (FIG. 3), EFNs 400 (FIG. 4), and/or any combination thereof.

In some demonstrative embodiments, gas sensor 500 may include three EFNs 510, e.g., as described below with reference to FIG. 6, or any other number of EFNs.

Figure 6:
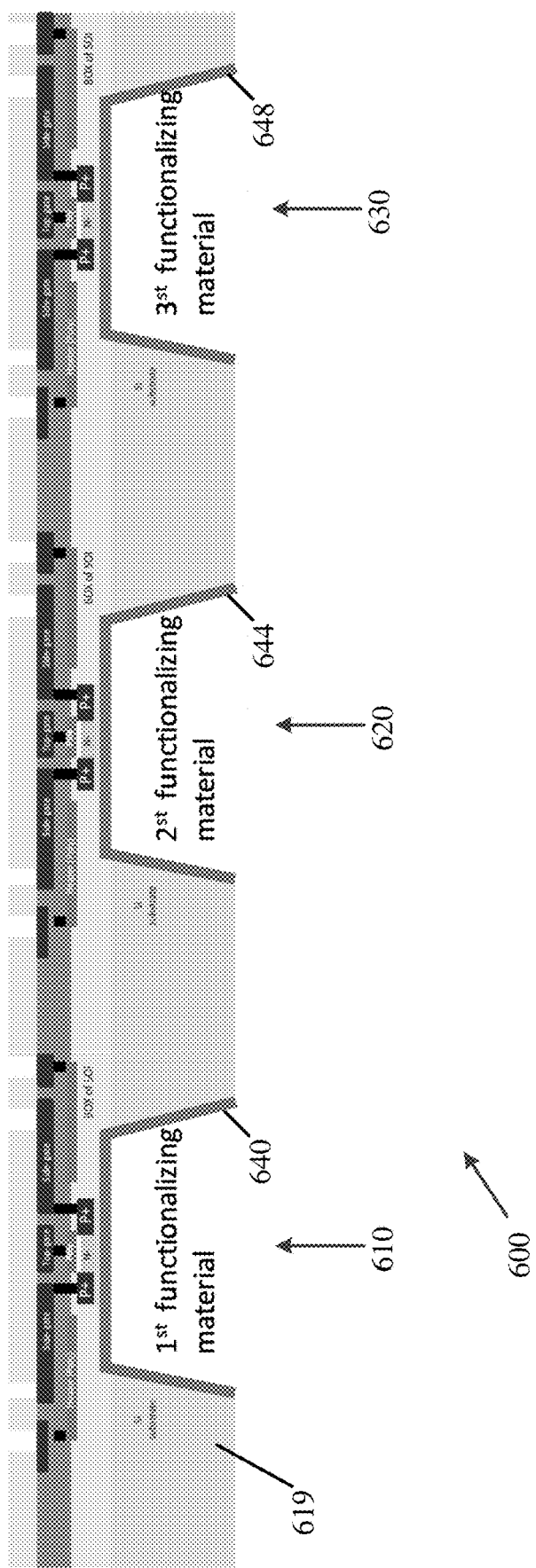
FIG. 6 is a schematic illustration of a multi-EFN, in accordance with some demonstrative embodiments.

Reference is made to FIG. 6, which schematically illustrates multi-EFN 600, in accordance with some demonstrative embodiments.

In one example, multi-EFN 600 may be configured for parallel sensing of at least three different types of gas.

In some demonstrative embodiments, as shown in FIG. 6, multi EFN 600 may include a first EFN 610, e.g., a first EFN 300 (FIG. 3), including a first sensing area 640 in a first opening in the backside of the silicon substrate 619. First sensing area 640 may include a first functional layer in contact with first sensing area 640, which may be configured to react with a first predefined type of gas.

In some demonstrative embodiments, as shown in FIG. 6, multi EFN 600 may include a second EFN 620, e.g., a second EFN 300 (FIG. 3), including a second sensing area 644 in a second opening in the backside of the silicon substrate 619. EFN 620 may include a second functional layer in contact with second sensing area 644, which may be configured to react with a second predefined type of gas.

In some demonstrative embodiments, as shown in FIG. 6, multi EFN 600 may include a third EFN 630, e.g., a third EFN 300 (FIG. 3), including a third sensing area 648 in a third opening in the backside of the silicon substrate 619.

EFN 630 may include a third functional layer in contact with third sensing area 648, which may be configured to react with a third predefined type of gas.

In other embodiments, multi EFN 600 may include any other number of EFNs.

Referring back to FIG. 5, in some demonstrative embodiments, gas sensor 500 may include a detector 520 to detect the at least one predefined gas, for example, based on a current via a conductive channel in a wire region of EFN 510.

In one example, detector 520 may be configured to detect three types of gas, for example, if EFN 510 includes multi-EFN 600 (FIG. 6). According to this example, detector 520 may detect a first type of gas, for example, based on a first current via a first conductive channel in a wire region of EFN 610 (FIG. 6), a second type of gas, for example, based on a second current via a second conductive channel in a wire region of EFN 620 (FIG. 6), and/or a third type of gas, for example, based on a third current via a third conductive channel in a wire region of EFN 630 (FIG. 6).

Figure 7:
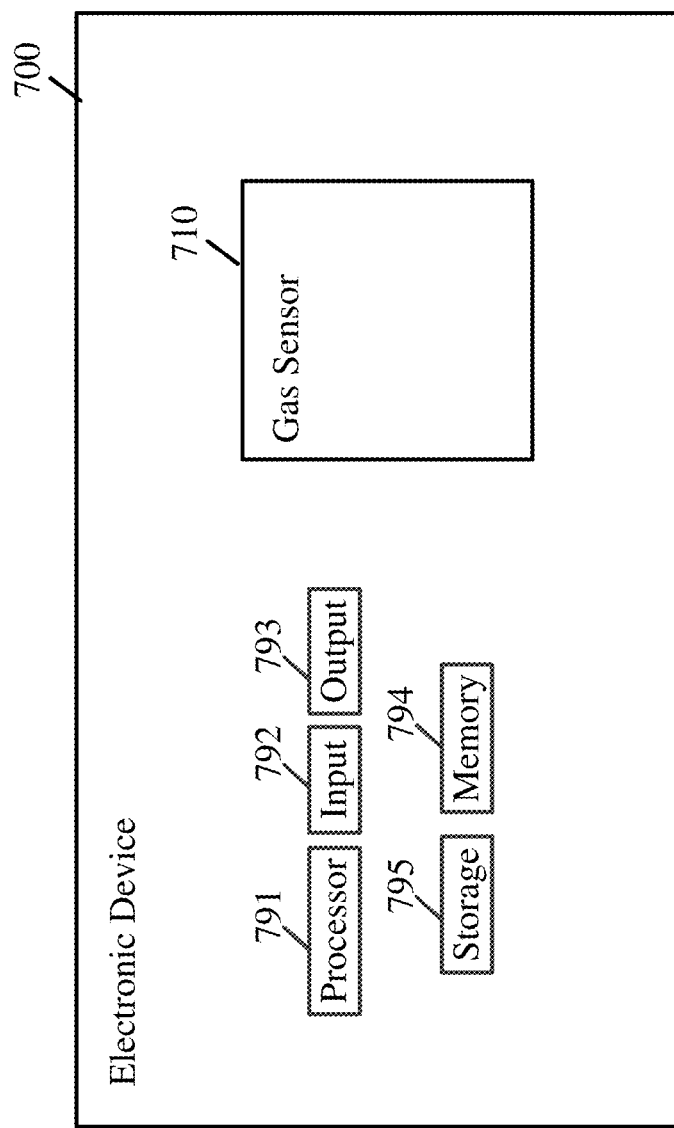
FIG. 7 is a schematic block diagram illustration of an electronic device, in accordance with some demonstrative embodiments.

Reference is made to FIG. 7, which schematically illustrates a block diagram of an electronic device 700, in accordance with some demonstrative embodiments.

In some demonstrative embodiments, electronic device 700 may include, for example, an IoT device.

In one example, electronic device 700 may include, for example, an IoT remote (mote), e.g., including a sensor and a transceiver to transmit one or more transmissions based on an output of the sensor.

In some demonstrative embodiments, electronic device 700 may include a gas sensing device.

In some demonstrative embodiments, electronic device 700 may include a computing device, an electrical device, a mobile device, a mobile phone, a Smartphone, a tablet computer, a handheld computer, an Internet of Things (IoT) device, a power charging device, a sensor device, a sensing device, a handheld device, a wearable device, a gaming device, or the like.

In some demonstrative embodiments, the electronic device 700 may include any other type of electronic device.

In some demonstrative embodiments, electronic device 700 may include or may be implemented as an Integrated Circuit (IC).

In some demonstrative embodiments, electronic device 700 may include a gas sensor 710.

In some demonstrative embodiments, gas sensor 710 may include one or more elements of, may perform one or more operations of, and/or one or more functionalities of, gas sensor 500 (FIG. 5).

In some demonstrative embodiments, electronic device 700 may include a controller/processor 791 including circuitry configured to control electronic device 700 to perform one or more operations, for example, based on an output of gas sensor 710.

In one example, controller 791 may control electronic device 700 to perform one or more operations, for example, based on a detection of at least one predefined type of gas, which may be sensed by gas sensor 710.

In some demonstrative embodiments, electronic device 700 may also include, for example, one or more of processor 791, an input unit 792, an output unit 793, a memory unit 794, and/or a storage unit 795. Electronic device 700 may optionally include other suitable hardware components and/or software components. In some demonstrative embodiments, some or all of the components of one or more electronic device 700 may be enclosed in a common housing or packaging, and may be interconnected or operably associated using one or more wired or wireless links.

Referring back to FIG. 1, in some demonstrative embodiments, the drain region 130 of EFN 100 may be reflectionally symmetric to the source region 120 of EFN 100, e.g., as described below.

In some demonstrative embodiments, the first lateral-gate area 122 of EFN 100 may be reflectionally symmetric to the second lateral-gate area 128 of EFN 100, e.g., as described below.

In some demonstrative embodiments, the drain region 130 may be aligned with the source region 120, e.g., as described below.

In some demonstrative embodiments, the second lateral-gate area 128 may be aligned with the first lateral-gate area 122, e.g., as described below.

In some demonstrative embodiments, a configuration of an EFN, e.g., EFN 100 EFN 200 (FIG. 2), EFN 300 (FIG. 3) and/or EFN 400 (FIG. 4), may provide one or more advantages and/or solutions to one or more technical problems, e.g., as described below.

In some demonstrative embodiments, the configuration of the EFN, e.g., as described above, may support back gate operation, for example, even with a reduced voltage, for example, even a voltage below 10V.

In some demonstrative embodiments, the configuration of the back-sensing EFN, e.g., as described above, may provide a technical advantage by providing an improved level of symmetry of lateral gate areas, e.g., lateral gate areas 122 and/or 128.

In some demonstrative embodiments, the configuration of the EFN, e.g., as described above, may provide a technical benefit in reducing leakage from lateral gate areas, e.g., lateral gate areas 122 and/or 128, to the source/drain regions, e.g., source region 120 and/the the drain region 120.

In some demonstrative embodiments, the configuration of the EFN, e.g., as described above, may provide a technical advantage of efficient sensing of one or more substances, e.g., a predefined type of gas. For example, the sensing area may be covered with a catalyst functionalizing material, e.g., Palladium and/or Platinum, which may act as a catalyst for sensing the substance.

In some demonstrative embodiments, the configuration of the EFN, e.g., as described above, may provide a technical advantage by providing an option to use a voltage at the top gate area to control a wire region. For example, EFN 100 may provide an option of using voltage at the top gate area 140, e.g., a formed Poly gate electrode, to control wire region 125, e.g., a quasi-nanowire, for example, in the vertical direction.

In some demonstrative embodiments, the configuration of the EFN, e.g., as described above, may provide a technical advantage by supporting scaling down of the EFN and/or providing a reduced device parameters spread, e.g., as described below.

In some demonstrative embodiments, an EFN, e.g., EFN 100 (FIG. 1), EFN 200 (FIG. 2), EFN 300 (FIG. 3) and/or EFN 400 (FIG. 4), may be fabricated according to a fabrication process, which may be configured to provide one or more advantages and/or solutions to one or more technical problems, e.g., as described below.

In some demonstrative embodiments, an EFN, e.g., e.g., EFN 100, EFN 200 (FIG. 2), EFN 300 (FIG. 3) and/or EFN 400 (FIG. 4), may be fabricated by a fabrication process which may be configured, for example, to enable an alignment of a drain region of the EFN and a source region of the EFN; and/or an alignment of a first lateral-gate area of the EFN and a second lateral-gate area of the EFN, e.g., as described below.

Figure 8:
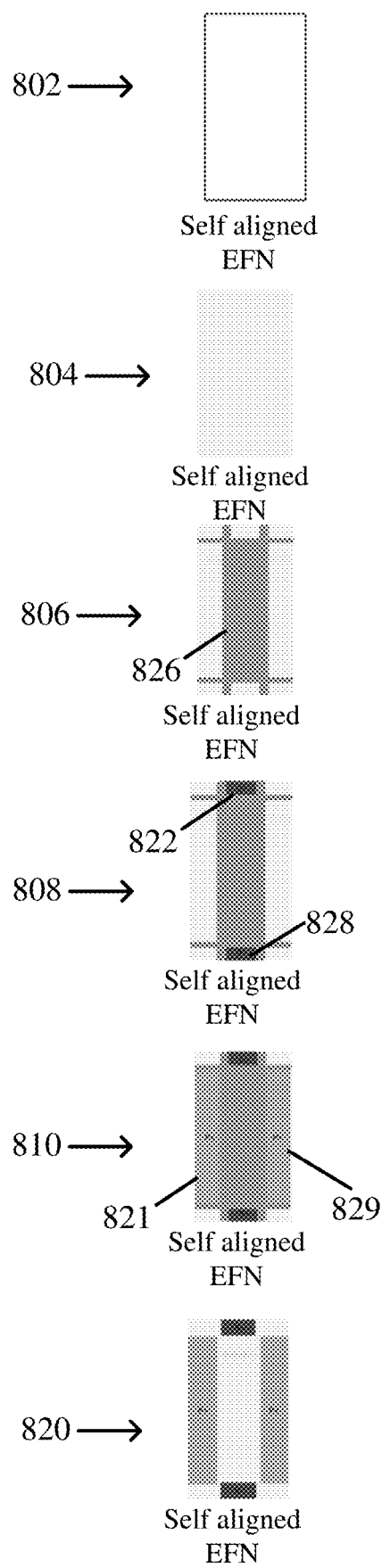
FIG. 8 is a schematic illustration of a fabrication process to fabricate an EFN, in accordance with some demonstrative embodiments.

In one example, the EFN, e.g., EFN 100, may be fabricated, for example, in a manner which may enable alignment of the drain region 130 and the source region 120, and/or alignment of the second lateral-gate area 128 and the first lateral-gate area 122, e.g., as described below. Reference is made to FIG. 8, which schematically illustrates a fabrication process 800 to fabricate an EFN, in accordance with some demonstrative embodiments.

In some demonstrative embodiments, one or more elements of EFN 100 (FIG. 1), EFN 200 (FIG. 2), EFN 300 (FIG. 3), and/or EFN 400 (FIG. 4) may be fabricated, for example, using one or more operations and/or fabrication stages of fabrication process 800.

In some demonstrative embodiments, fabrication process 800 may include a fabrication stage 802, which may include forming a Shallow Trench Isolation (STI) around a device layer of a silicon substrate.

In some demonstrative embodiments, fabrication process 800 may include a fabrication stage 804, which may include implanting the silicon substrate, e.g., using n-type dopant, for example, to form a wire region, e.g., a Well implant. In one example, the implantation may be with Phosphorous, Arsenic and/or any other dopant.

In some demonstrative embodiments, fabrication process 800 may include a fabrication stage 806, which may include forming a hard mask 826. In one example, the hard Mask 826 may be used for a self-aligned process, e.g., as described below.

In some demonstrative embodiments, fabrication stage 806 may include patterning and etching, for example, in a CMOS process, e.g., to create the hard mask 826. The hard mask 826 may be operable as a top gate, e.g., a Poly gate.

In some demonstrative embodiments, fabrication stage 806 may include patterning the Poly and forming pocket implants and/or spacers around the hard mask 826, for example, before further implants, e.g., as described below.

Figure 9:
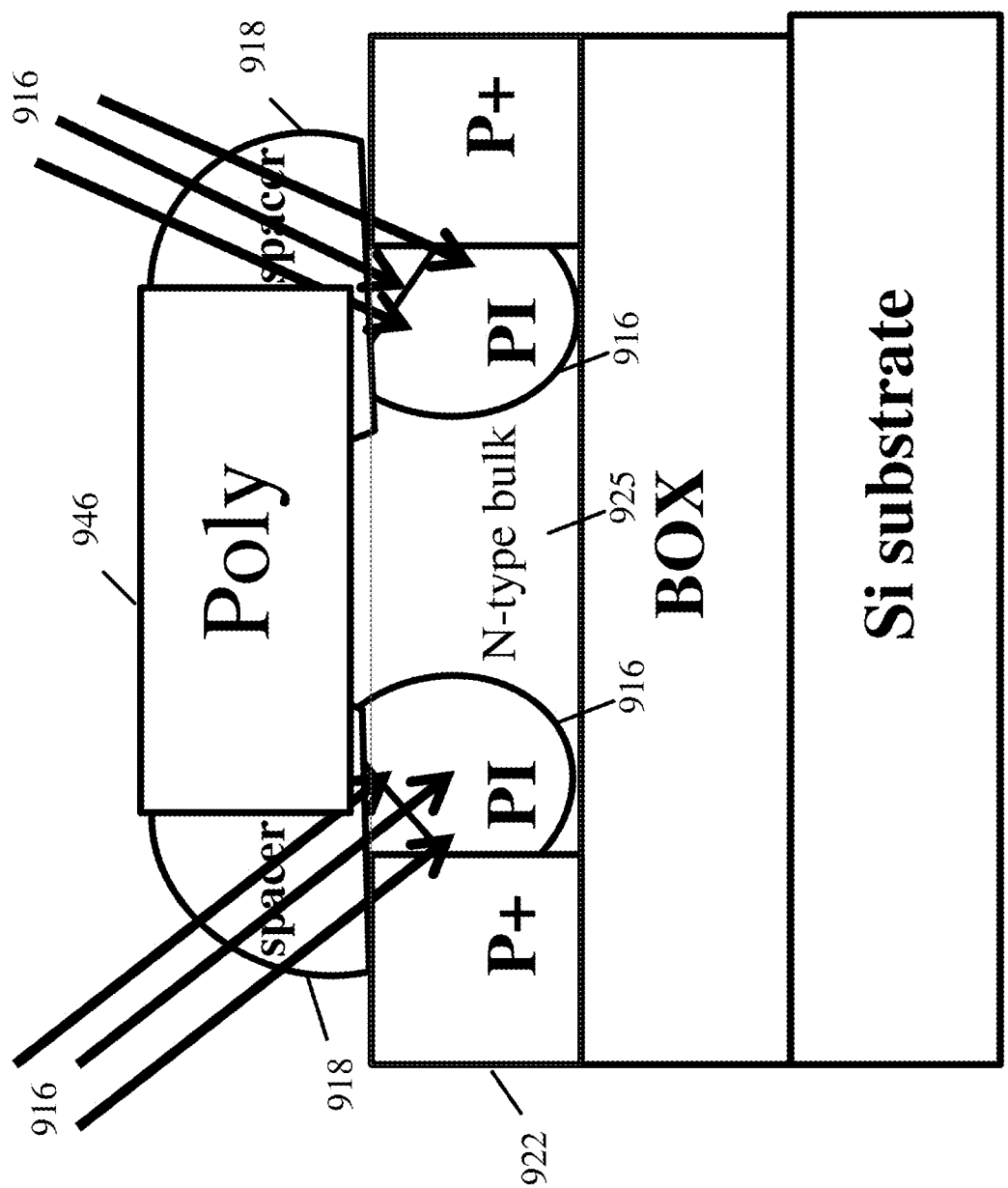
FIG. 9 is a schematic illustration of a cross section of an EFN during a fabrication process, in accordance with some demonstrative embodiments.

Reference is made to FIG. 9, which schematically illustrates a cross section of an EFN 900 during a fabrication process, in accordance with some demonstrative embodiments.

In some demonstrative embodiments, as shown in FIG. 9, fabricating the EFN 900 may include, for example, forming Pocket Implants (PIs) 916, for example, using a hard mask 946, for example, the poly silicon hard mask described above with respect to fabrication stage 806 (FIG. 8). The size and/or location of the PIs 916 may be designed, for example, configure, define, and/or control a size of the wire region of the EFN 900, e.g., as described below.

In some demonstrative embodiments, as shown in FIG. 9, PIs 916 may be formed, for example, on both surfaces of a wire region 925.

In some demonstrative embodiments, as shown in FIG. 9, fabricating the EFN 900 may include, for example, forming a spacer region around a top gate area, e.g., the hard mask 946. For example, the spacer region may include one or more spacers 918, e.g., to isolate the top-gate area.

In one example, the Pocket implants 916 may be formed after applying of the Poly silicon hard mask, e.g., before formation of spacers 918, etching the Box layer and/or further N+ implant, for example, at an angle between 30-45%.

In some demonstrative embodiments, Pocket Implants 916 may change a doping in the wire region 925, e.g., N-type bulk, which may be close to lateral gates 922 and 928, e.g., the P+ gates.

In some demonstrative embodiments, the PI 916 may be implanted, for example, using Boron doping. The PI may compensate N-bulk doping directly near a junction, which may allow, for example, a achieving an improved, e.g., a precise, control of a width of the wire region 925. For example, PI 916 may influence the width of the depletion regions in the wire region 925, which may allow a better control of the size of the depletion regions in wire region 925.

In one example, implantation of the PI 916 may be performed, for example, using Phosphorus and Arsenic (n-doping), Boron and $BF_2$ (p-doping), and/or with any other dopant.

In one example, PI 916 may be implemented in scaled down devices, for example, to avoid short channel effects. According tot his example, the PI may be a strong implant.

Referring back to FIG. 8, in some demonstrative embodiments fabrication process 800 may include a fabrication stage 808, which may include implanting of N-type dopant, e.g., an N+ implant, for example, in a source region 822 and in a drain region 828, which may be aligned to hard mask 826.

In one example, the N+ implant may have a thickness of 1000 A Silicon Nitride, or any other suitable thickness may be utilized.

In some demonstrative embodiments, fabrication process 800 may include a fabrication stage 810, which may include implanting of P-type dopant, for example, in a first lateral gate area 821 and in a second lateral gate area 829, e.g., a P+ implant, which may be aligned to hard mask 826.

In some demonstrative embodiments, fabrication process 800 may optionally include one or more fabrication stages, which may be implemented, for example, when fabricating a front-sensing EFN, e.g., as described below. In other embodiments, one or more of these fabrication stages may be omitted, for example, when fabricating a back-sensing EFN.

In some demonstrative embodiments, fabrication process 800 may include a fabrication stage 810, which may include removing of hard mask 826, for example, using the oxide under hard mask 826 as an etch stop.

In some demonstrative embodiments, fabrication process 800 may further include applying one or more CMOS (or CMOS-like) operations, which may include, for example, implanting of drive-ins, forming contacts and B/E metallization, using a mask to open a sensing area in the front-side, performing a fictionalization of a sensing surface, and/or any other operation.

In some demonstrative embodiments, one or more of the operations of fabrication process 800, as described above, may be utilized for fabrication of an EFN in a self-aligned manner, for example, in a manner, which may provide an alignment comparable to an alignment provided by fabrication of CMOS transistors.

In some demonstrative embodiments, one or more of the operations of fabrication process 800, as described above, may be utilized to enable alignment of a drain region and a source region of the EFN, e.g., regions 822 and 828, and/or alignment of lateral-gate areas of the EFN, for example, area 829 and 821, e.g., as described below.

In some demonstrative embodiments, one or more of the operations of fabrication process 800, as described above, may be utilized to provide a solution to one or more technical problems, e.g., as described below.

In one example, fabrication process 800 may provide a solution, for example, to technical problem of misalignment and size variations, which may be a result of fabricating an EFN. For example, distances between the lateral gate areas and their alignment to trench isolation and the source and drain regions may be critical for the device operation. Using non-critical masks that define critical dimensions of a transistor may result in misalignment and size variations of the lateral gate areas and their alignment to trench isolation and the source and drain regions. The misalignments and the size variations may predict large electrical parameters spread, e.g., up to the level, when increased leakages between the lateral gate areas and the drain source regions are observed.

In some demonstrative embodiments, a one or more operations of the fabrication process 800 may be configured to utilize hard mask 826 as part of fabrication process 800, for example, to fabricate an EFN in a self-aligned manner, and/or to enable opening of a sensing surface, e.g., when fabricating a front-sensing EFN, e.g., as described above.

In some demonstrative embodiments, one or more of the operations of fabrication process 800, as described above, may be utilized to enable using Poly, e.g., hard mask 826, in gate area 140 (FIG. 1) and/or in a standard gate oxide of a CMOS process, which may allow to decrease the $V_{BG}$ voltages to be applied to an EFN, thus enabling low power operation, e.g., in an implementation of a gas sensor. For example, heating of membranes, e.g., using heater 435 (FIG. 4), may be performed by short pulses of current, which may avoid energy limitations.

In some demonstrative embodiments, in some use cases, implementations and/or scenarios fabrication of a back-sensing EFN e.g., EFN 100 (FIG. 1), EFN 200 (FIG. 2), EFN 300 (FIG. 3), and/or EFN 400 (FIG. 4), may have one or more technical advantages, for example, compared to fabrication of a front sensing EFN, e.g., as described below.

In some demonstrative embodiments, fabrication of a back-sensing EFN may be less complicated compared to fabrication of front-sensing EFNs, which may require, for example, local removal of films to achieve access to the sensing surface.

In some demonstrative embodiments, fabrication of an EFN as a membrane type sensor, e.g. EFN 300 (FIG. 3), having a sensing area, e.g., sensing area 340 (FIG. 3), e.g., at the bottom side of the membrane, may provide one or more advantages, for example, compared to fabrication of a front sensing EFN, e.g., as described below.

In one example, fabrication of a front sensing EFN having a sensing area in a front side, for example, over an already fabricated CMOS circuit, may be technologically difficult and/or may require modifications of a CMOS process, e.g., a core CMOS process. For example, a front-sensing EFN may require access to a sensing surface, to form contacts through the sensing layer, and/or to deposit the sensing layer locally, which may be technologically difficult in some cases and/or implementations.

Figure 10:
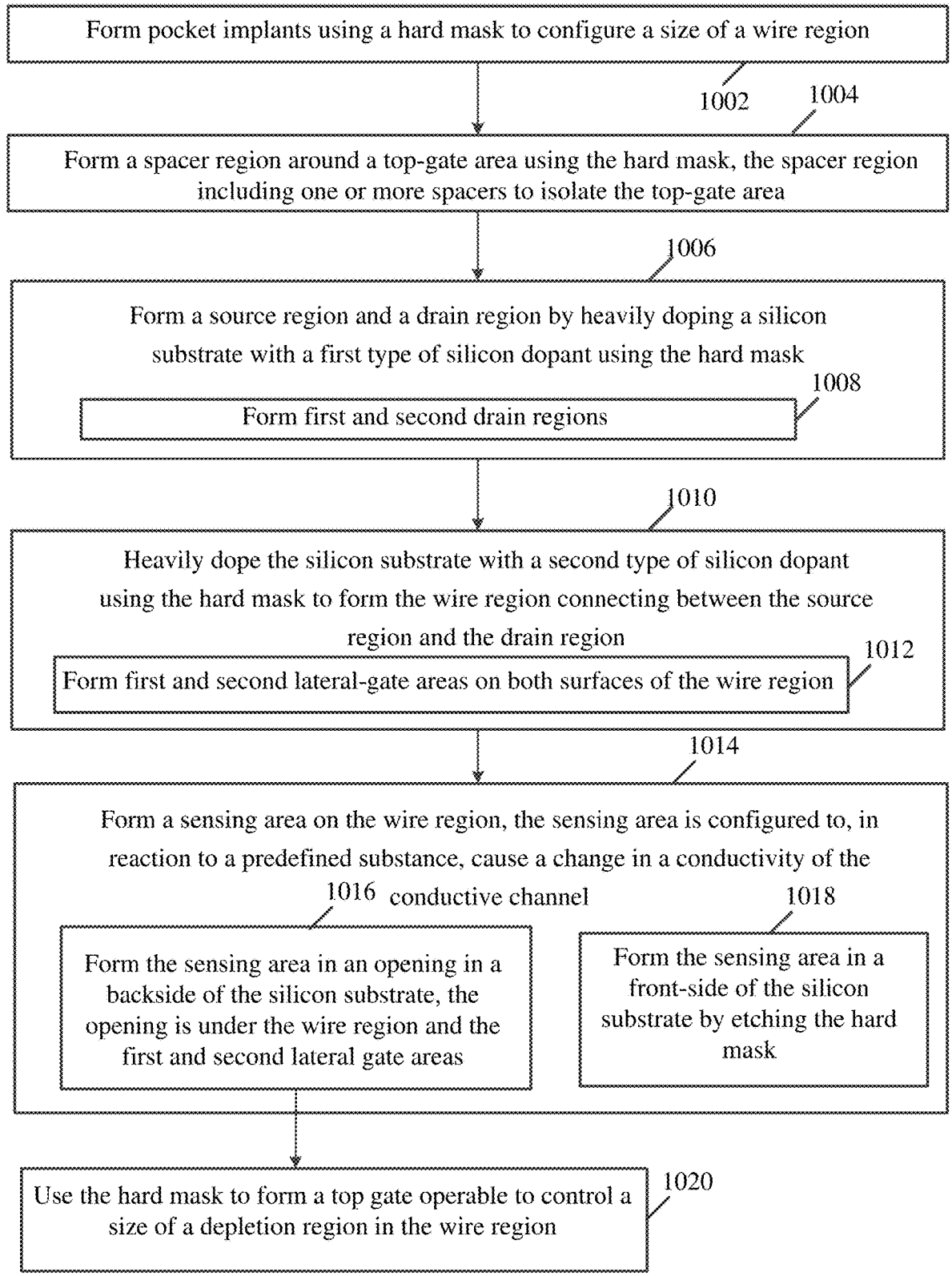
FIG. 10 is a schematic flow-chart illustration of a method of fabricating an EFN, in accordance with some demonstrative embodiments.

Reference is made to FIG. 10, which schematically illustrates a method of fabricating an EFN, in accordance with some demonstrative embodiments. For example, one or more of the operations of the method of FIG. 10 may be performed during a fabrication process of EFN 100 (FIG. 1), EFN 200 (FIG. 2), EFN 300 (FIG. 3), and/or EFN 400 (FIG. 4).

As indicated at block 1006, the method may include forming a source region and a drain region by heavily doping a silicon substrate with a first type of silicon dopant using a hard mask. For example, fabricating of the EFN may include, for example, forming source region 822 (FIG. 8) and the drain region 828 (FIG. 8), for example, by heavily doping the silicon substrate 810 (FIG. 8) with the first type of silicon dopant using the hard mask 826 (FIG. 8), e.g., as described above.

In some demonstrative embodiments, the hard mask may include polysilicon. In other embodiments, that hard mask may include any other masking material.

In some demonstrative embodiments, the method may optionally include performing one or more fabrication operations, for example, when fabricating a multi-drain EFN, e.g., as described below.

As indicated at block 1006, the method may include forming a source region and at least first and second drain regions, for example, when fabricating a multi-drain EFN. For example, EFN 400 (FIG. 1) may be fabricated, for example, by forming source region 420 (FIG. 4) the first drain region 432 (FIG. 4) and the second drain region 434 (FIG. 4).

As indicated at block 1008, the method may include heavily doping the silicon substrate with a second type of silicon dopant using the hard mask to form a wire region connecting between the source region and the drain region.

As indicated at block 1010, heavily doping the silicon substrate with the second type of silicon dopant may include forming first and second lateral-gate areas on both surfaces of the wire region. For example, the wire region may be configured to drive a current between the source and drain regions via a conductive channel, e.g., as described above.

In some demonstrative embodiments, the second type of silicon dopant may include P-type silicon. In other embodiments, the second type of silicon dopant may include any other dopant.

For example, fabricating the EFN may include, heavily doping the silicon substrate 810 (FIG. 8) with a second type of silicon dopant using the hard mask, for example, to form the wire region connecting between the source region 822 (FIG. 8) and the drain region 828 (FIG. 8), by forming first lateral-gate area 821 (FIG. 8) and second lateral-gate area 829 (FIG. 8) on both surfaces of the wire region. The wire region may be configured to drive the current between the source region 822 (FIG. 8) and the drain region 828 (FIG. 8) via the conductive channel, e.g., as described above.

In some demonstrative embodiments, the method may include one or more additional operations to fabricate one or more elements of the EFN using the hard mask, e.g., as described below.

As indicated at block 1002, the method may include forming pocket implants, e.g., using the hard mask, to configure a size of the wire region. For example, fabricating the EFN may include, for example, forming Pocket Implants (PIs) 916 (FIG. 9) using the hard mask 826 (FIG. 8), e.g., as described above.

As indicated at block 1004, the method may include forming a spacer region around the top-gate area using the hard mask, the spacer region including one or more spacers to isolate the top-gate area. For example, fabricating the EFN may include, for example, forming spacer region 148 (FIG. 1) around the top-gate area 140 (FIG. 1) using the hard mask 826 (FIG. 8). For example, the spacer region 148 (FIG. 1) may include one or more spacers to isolate the top-gate 140 (FIG. 1), e.g., as described above.

In some demonstrative embodiments, the method may include forming the drain region aligned with the source region, and forming the second lateral-gate area aligned with the first lateral-gate area. For example, fabricating of the EFN may include, for example, forming the drain region 828 (FIG. 8) aligned with the source region 822 (FIG. 8), and forming the first lateral-gate area 821 (FIG. 8) aligned with the second lateral-gate area 829 (FIG. 8), for example, by using the hard mask 826 (FIG. 8).

In some demonstrative embodiments, the method may include forming the drain region reflectionally symmetric to the source region, and forming the first lateral-gate area reflectionally symmetric to the second lateral-gate area. For example, fabricating of the EFN may include forming the drain region 828 (FIG. 8) reflectionally symmetric to the source region 822 (FIG. 8), and/or forming the first lateral-gate area 821 (FIG. 8) reflectionally symmetric to the second lateral-gate area 829 (FIG. 8), for example, by using the hard mask 826 (FIG. 8), e.g., as described above.

As indicated at block 1014, the method may include forming a sensing area on the wire region, the sensing area configured to, in reaction to a predefined substance, cause a change in a conductivity of the conductive channel. For example, fabricating of EFN 100 (FIG. 1) may include, for example, forming the sensing area 140 (FIG. 1) on wire region 125 (FIG. 1), e.g., as described above.

In some demonstrative embodiments, the method may optionally include one or more additional and/or alternative operations, for example, when fabricating a front sensing EFN or fabricating a backside EFN, e.g., as described below.

In some demonstrative embodiments, as indicated at block 1018 the method may include forming the sensing area in a front-side of the silicon substrate by etching the hard mask, for example, when fabricating a front sensing EFN. For example, fabricating EFN 812 (FIG. 8) may include forming the sensing area in a front-side of the silicon substrate 810 (FIG. 8), for example, by etching the hard mask 826 (FIG. 8) e.g., as described above.

As indicated at block 1016, forming the sensing area may include forming the sensing area in an opening in a backside of the silicon substrate, for examples when fabricating a backside EFN. For example, the opening may be under the wire region and the first and second lateral gate areas. For example, the sensing area 140 (FIG. 1) may be formed in the opening in the backside of the silicon substrate 110 (FIG. 1), for example, such that the opening is under the wire region 125 (FIG. 1), the first lateral gate area 122 (FIG. 1) and the second lateral gate area 128 (FIG. 1), e.g., as described above In some demonstrative embodiments, forming the opening may include forming the opening by etching a BOX layer from the backside of the silicon substrate. For example, fabricating of EFN 100 (FIG. 1) may include, for example, forming the opening area by etching the BOX layer 112 (FIG. 1) from the backside of the silicon substrate 110 (FIG. 1).

In some demonstrative embodiments, forming the sensing area may include forming a dielectric layer on the wire region. For example, forming the sensing area 140 (FIG. 1) may include, for example, forming the dielectric layer 124 (FIG. 1) on the wire region 125 (FIG. 1).

In some demonstrative embodiments, the method may include forming a functional layer at the backside of the silicon substrate and in contact with the sensing area, the functional layer configured to react with the predefined substance. For example, fabricating of EFN 100 (FIG. 1) may include, for example, forming functional layer 142 (FIG. 1) at the backside of the silicon substrate and in contact with the sensing area 140 (FIG. 1), e.g., as described above.

As indicated at block 1020, the method may include using the hard mask to form a top gate operable to control a size of a depletion region in the wire region. For example, fabricating of EFN 100 (FIG. 1) may include using the hard mask 826 (FIG. 8), for example, to form the top gate 140 (FIG. 1), which may be operable to control the size of the depletion region in the wire region 125 (FIG. 1), e.g., as described above.

EXAMPLES

The following examples pertain to further embodiments.

Example 1 includes an Electrostatically Formed Nanowire (EFN) comprising a source region; at least one drain region; a wire region configured to drive a current between the source and drain regions via a conductive channel; a first lateral-gate area extending along a first surface of the wire region between the source and drain regions; a second lateral-gate area extending along a second surface of the wire region between the source and drain regions; and a sensing area in an opening in a backside of a silicon substrate under the wire region and the first and second lateral-gate areas, the sensing area configured to, in reaction to a predefined substance, cause a change in a conductivity of the conductive channel.

Example 2 includes the subject matter of Example 1, and optionally, comprising at least first and second drain regions, the wire region configured to, based on a first voltage at the first lateral-gate area and a second voltage at the second lateral-gate area, drive the current between the source region and the first drain region or the second drain region.

Example 3 includes the subject matter of Example 1 or 2, and optionally, wherein the sensing area is in a Buried Oxide (BOX) layer of the silicon substrate.

Example 4 includes the subject matter of Example 1 or 2, and optionally, wherein the sensing area comprises a dielectric layer in contact with the first and second lateral-gate areas and the wire region.

Example 5 includes the subject matter of Example 4, and optionally, wherein a thickness of the dielectric layer is between 50-200 Angstrom (A).

Example 6 includes the subject matter of any one of Examples 1-5, and optionally, comprising a top-gate area over a third surface of the wire region.

Example 7 includes the subject matter of Example 6, and optionally, wherein the top-gate area is operable to control a vertical size of a depletion region in the wire region.

Example 8 includes the subject matter of Example 6 or 7, and optionally, wherein the top-gate area comprises hard masked poly silicon.

Example 9 includes the subject matter of any one of Examples 6-8, and optionally, comprising a spacer region around the top-gate area, the spacer region comprising one or more spacers to isolate the top-gate area.

Example 10 includes the subject matter of any one of Examples 1-9, and optionally, comprising a functional layer at the backside of the silicon substrate and in contact with the sensing area, the functional layer configured to react with the predefined substance.

Example 11 includes the subject matter of Example 10, and optionally, wherein the functional layer comprises at least one of Palladium or Platinum.

Example 12 includes the subject matter of Example 10 or 11, and optionally, wherein the functional layer is operable as a backside-gate to control a vertical size of a depletion region in the wire region.

Example 13 includes the subject matter of any one of Examples 1-12, and optionally, wherein the predefined substance comprises a gas.

Example 14 includes the subject matter of any one of Examples 1-13, and optionally, comprising a heater configured to heat the wire region.

Example 15 includes the subject matter of any one of Examples 1-14, and optionally, wherein the first and second lateral-gate areas are operable to control a lateral size of a depletion region in the wire region.

Example 16 includes the subject matter of any one of Examples 1-15, and optionally, wherein the drain region is reflectionally symmetric to the source region, and the first lateral-gate area is reflectionally symmetric to the second lateral-gate area.

Example 17 includes the subject matter of any one of Examples 1-16, and optionally, wherein the drain region is aligned with the source region, and the second lateral-gate area is aligned with the first lateral-gate area.

Example 18 includes the subject matter of any one of Examples 1-18, and optionally, wherein the source and drain regions comprise heavily doped N-type silicon, and the first and second lateral-gate areas comprise heavily doped P-type silicon.

Example 19 includes a gas sensor configures to sense at least one predefined type of gas, the gas sensor comprising at least one Electrostatically Formed Nanowire (EFN) comprising a source region; at least one drain region; a wire region configured to drive a current between the source and drain regions via a conductive channel; a first lateral-gate area extending along a first surface of the wire region between the source and drain regions; a second lateral-gate area extending along a second surface of the wire region between the source and drain regions; and a sensing area in an opening in a backside of a silicon substrate under the wire region and the first and second lateral-gate areas, the sensing area configured to, in reaction to a predefined gas, cause a change in a conductivity of the conductive channel; and a detector to detect the predefined gas based on the current via the conductive channel.

Example 20 includes the subject matter of Example 19, and optionally, wherein the EFN comprises at least first and second drain regions, the wire region configured to, based on a first voltage at the first lateral-gate area and a second voltage at the second lateral-gate area, drive the current between the source region and the first drain region or the second drain region.

Example 21 includes the subject matter of Example 19 or 20, and optionally, wherein the sensing area is in a Buried Oxide (BOX) layer of the silicon substrate.

Example 22 includes the subject matter of Example 19 or 20, and optionally, wherein the sensing area comprises a dielectric layer in contact with the first and second lateral-gate areas and the wire region.

Example 23 includes the subject matter of Example 22, and optionally, wherein a thickness of the dielectric layer is between 50-200 Angstrom (A).

Example 24 includes the subject matter of any one of Examples 19-23, and optionally, wherein the EFN comprises a top-gate area over a third surface of the wire region.

Example 25 includes the subject matter of Example 24, and optionally, wherein the top-gate area is operable to control a vertical size of a depletion region in the wire region.

Example 26 includes the subject matter of Example 24 or 25, and optionally, wherein the top-gate area comprises hard masked poly silicon.

Example 27 includes the subject matter of any one of Examples 24-26, and optionally, wherein the EFN comprises a spacer region around the top-gate area, the spacer region comprising one or more spacers to isolate the top-gate area.

Example 28 includes the subject matter of any one of Examples 19-27, and optionally, wherein the EFN comprises a functional layer at the backside of the silicon substrate and in contact with the sensing area, the functional layer configured to react with the predefined substance.

Example 29 includes the subject matter of Example 28, and optionally, wherein the functional layer comprises at least one of Palladium or Platinum.

Example 30 includes the subject matter of Example 28 or 29, and optionally, wherein the functional layer is operable as a backside-gate to control a vertical size of a depletion region in the wire region.

Example 31 includes the subject matter of any one of Examples 19-30, and optionally, wherein the predefined substance comprises a gas.

Example 32 includes the subject matter of any one of Examples 19-31, and optionally, wherein the EFN comprises a heater configured to heat the wire region.

Example 33 includes the subject matter of any one of Examples 19-32, and optionally, wherein the first and second lateral-gate areas are operable to control a lateral size of a depletion region in the wire region.

Example 34 includes the subject matter of any one of Examples 19-33, and optionally, wherein the drain region is reflectionally symmetric to the source region, and the first lateral-gate area is reflectionally symmetric to the second lateral-gate area.

Example 35 includes the subject matter of any one of Examples 19-34, and optionally, wherein the drain region is aligned with the source region, and the second lateral-gate area is aligned with the first lateral-gate area.

Example 36 includes the subject matter of any one of Examples 19-35, and optionally, wherein the source and drain regions comprise heavily doped N-type silicon, and the first and second lateral-gate areas comprise heavily doped P-type silicon.

Example 37 includes the subject matter of any one of Examples 19-36, and optionally, comprising two or more EFNs configured to sense two or more respective predefined types of gas.

Example 38 includes a method of fabricating an Electrical Formed Nanowire (EFN), the method comprising forming a source region and a drain region by heavily doping a silicon substrate with a first type of silicon dopant using a hard mask; heavily doping the silicon substrate with a second type of silicon dopant using the hard mask to form a wire region connecting between the source region and the drain region by forming first and second lateral-gate areas on both surfaces of the wire region, the wire region configured to drive a current between the source and drain regions via a conductive channel; and forming a sensing area on the wire region, the sensing area is configured to, in reaction to a predefined substance, cause a change in a conductivity of the conductive channel.

Example 39 includes the subject matter of Example 38, and optionally, comprising forming the sensing area in an opening in a backside of the silicon substrate, the opening is under the wire region and the first and second lateral gate areas.

Example 40 includes the subject matter of Example 39, and optionally, comprising using the hard mask to form a top gate area operable to control a size of a depletion region in the wire region.

Example 41 includes the subject matter of Example 40, and optionally, comprising forming a spacer region around the top-gate area using the hard mask, the spacer region comprising one or more spacers to isolate the top-gate area.

Example 42 includes the subject matter of any one of Examples 39-41, and optionally, comprising forming the opening by etching a Buried Oxide (BOX) layer from the backside of the silicon substrate.

Example 43 includes the subject matter of any one of Examples 39-42, and optionally, wherein forming the sensing area comprises forming a dielectric layer on the wire region.

Example 44 includes the subject matter of any one of Examples 39-43, and optionally, comprising forming pocket implants, using the hard mask, to configure a size of the wire region.

Example 45 includes the subject matter of any one of Examples 39-44, and optionally, comprising forming a functional layer at the backside of the silicon substrate and in contact with the sensing area, the functional layer configured to react with the predefined sub stance.

Example 46 includes the subject matter of any one of Examples 39-45, and optionally, wherein forming the at least one drain region comprises forming at least first and second drain regions.

Example 47 includes the subject matter of Example 38, and optionally, comprising forming the sensing area in a front-side of the silicon substrate by etching the hard mask.

Example 48 includes the subject matter of any one of Examples 39-47, and optionally, wherein the hard mask comprises polysilicon.

Example 49 includes the subject matter of any one of Examples 39-48, and optionally, comprising forming the drain region reflectionally symmetric to the source region, and forming the first lateral-gate area reflectionally symmetric to the second lateral-gate area.

Example 50 includes the subject matter of any one of Examples 39-49, and optionally, comprising forming the drain region aligned with the source region, and forming the second lateral-gate area aligned with the first lateral-gate area.

Example 51 includes the subject matter of any one of Examples 39-50, and optionally, wherein the first type of silicon dopant comprises N-type silicon, and the second type of silicon dopant comprises P-type silicon.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An Electrostatically Formed Nanowire (EFN) comprising:
   a source region;
   at least one drain region;
   a wire region configured to drive a current between the source and drain regions via a conductive channel;
   a first lateral-gate area extending along a first surface of the wire region between said source and drain regions;
   a second lateral-gate area extending along a second surface of the wire region between said source and drain regions; and
   a sensing area in an opening in a backside of a silicon substrate under the wire region and the first and second lateral-gate areas, the sensing area configured to, in reaction to a predefined substance, cause a change in a conductivity of the conductive channel.

2. The EFN of claim 1 comprising at least first and second drain regions, the wire region configured to, based on a first voltage at the first lateral-gate area and a second voltage at the second lateral-gate area, drive the current between the source region and the first drain region or the second drain region.

3. The EFN of claim 1, wherein the sensing area is in a Buried Oxide (BOX) layer of the silicon substrate.

4. The EFN of claim 1, wherein the sensing area comprises a dielectric layer in contact with the first and second lateral-gate areas and the wire region.

5. The EFN of claim 1 comprising a top-gate area over a third surface of said wire region.

6. The EFN of claim 5, wherein the top-gate area is operable to control a vertical size of a depletion region in the wire region.

7. The EFN of claim 1 comprising a functional layer at the backside of the silicon substrate and in contact with the sensing area, the functional layer configured to react with the predefined substance.

8. The EFN of claim 7, wherein the functional layer is operable as a backside-gate to control a vertical size of a depletion region in the wire region.

9. The EFN of claim 1, wherein the predefined substance comprises a gas.

10. The EFN of claim 1 comprising a heater configured to heat the wire region.

11. The EFN of claim 1, wherein the first and second lateral-gate areas are operable to control a lateral size of a depletion region in the wire region.

12. The EFN of claim 1, wherein the drain region is reflectionally symmetric to the source region, and the first lateral-gate area is reflectionally symmetric to the second lateral-gate area.

13. The EFN of claim 1, wherein the drain region is aligned with the source region, and the second lateral-gate area is aligned with the first lateral-gate area.

14. The EFN of claim 1, wherein the source and drain regions comprise heavily doped N-type silicon, and the first and second lateral-gate areas comprise heavily doped P-type silicon.

15. A gas sensor configures to sense at least one predefined type of gas, the gas sensor comprising:
   at least one Electrostatically Formed Nanowire (EFN) comprising:
      a source region;
      at least one drain region;
      a wire region configured to drive a current between the source and drain regions via a conductive channel;
      a first lateral-gate area extending along a first surface of the wire region between said source and drain regions;
      a second lateral-gate area extending along a second surface of the wire region between said source and drain regions; and
      a sensing area in an opening in a backside of a silicon substrate under the wire region and the first and second lateral-gate areas, the sensing area configured to, in reaction to a predefined gas, cause a change in a conductivity of the conductive channel; and a detector to detect the predefined gas based on the current via the conductive channel.

16. The gas sensor of claim 15 comprising two or more EFNs configured to sense two or more respective predefined types of gas.

* * * * *